United States Patent
Lee et al.

(10) Patent No.: US 10,466,328 B2
(45) Date of Patent: Nov. 5, 2019

(54) APPARATUS AND METHOD FOR GENERATING MAGNETIC RESONANCE IMAGE

(71) Applicant: SAMSUNG ELECTRONICS CO., LTD., Suwon-si (KR)

(72) Inventors: Dae-ho Lee, Seongnam-si (KR); Sung-pil Jung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1132 days.

(21) Appl. No.: 14/813,589

(22) Filed: Jul. 30, 2015

(65) Prior Publication Data
US 2016/0033600 A1    Feb. 4, 2016

(30) Foreign Application Priority Data
Jul. 30, 2014    (KR) .................. 10-2014-0097619

(51) Int. Cl.
*G01R 33/561*    (2006.01)
*G01R 33/54*    (2006.01)

(52) U.S. Cl.
CPC .......... *G01R 33/561* (2013.01); *G01R 33/543* (2013.01); *G01R 33/5611* (2013.01)

(58) Field of Classification Search
CPC . G01R 33/561; G01R 33/543; G01R 33/5611
See application file for complete search history.

(56) References Cited

U.S. PATENT DOCUMENTS

| | | | | |
|---|---|---|---|---|
| 8,587,307 B2* | 11/2013 | Ying | .................. | G01R 33/5611 324/307 |
| 8,823,372 B2* | 9/2014 | Weber | ................ | G01R 33/4833 324/307 |
| 9,396,562 B2* | 7/2016 | Lefebvre | ............... | G06T 11/005 |
| 9,482,732 B2* | 11/2016 | Chesneau | .......... | G01R 33/4824 |
| 9,655,522 B2* | 5/2017 | Li | ............................ | G06K 9/52 |
| 2004/0222794 A1 | 11/2004 | Griswold et al. | | |
| 2005/0174113 A1 | 8/2005 | Tsao et al. | | |

(Continued)

FOREIGN PATENT DOCUMENTS

| | | |
|---|---|---|
| JP | 2012-95686 A | 5/2012 |
| JP | 2012-95697 A | 5/2012 |

(Continued)

OTHER PUBLICATIONS

Communication dated Mar. 9, 2016, issued by the Korean Intellectual Property Office in counterpart Korean Application No. 10-2014-0097619.

(Continued)

*Primary Examiner* — Dixomara Vargas
(74) *Attorney, Agent, or Firm* — Sughrue Mion, PLLC

(57) ABSTRACT

A magnetic resonance imaging (MRI) apparatus includes a radio frequency (RF) coil configured to receive a magnetic resonance (MR) signal emitted from an object; a sampling pattern determiner configured to determine a sampling pattern of k-space based on a sensitivity of the RF coil and signal region information which is information about a signal region where the MR signal is generated; and a digital data obtainer configured to obtain digital data of the k-space by sampling the MR signal based on the determined sampling pattern.

22 Claims, 11 Drawing Sheets

(56) References Cited

U.S. PATENT DOCUMENTS

| | | | |
|---|---|---|---|
| 2006/0062731 A1* | 3/2006 | Bammer | A61B 5/0263 |
| | | | 424/9.3 |
| 2007/0182412 A1* | 8/2007 | Katscher | G01R 33/4824 |
| | | | 324/309 |
| 2008/0144900 A1* | 6/2008 | Li | G01R 33/4824 |
| | | | 382/130 |
| 2008/0154115 A1* | 6/2008 | Fuderer | G01R 33/5611 |
| | | | 600/410 |
| 2009/0285463 A1 | 11/2009 | Otazo et al. | |
| 2011/0006768 A1* | 1/2011 | Ying | G01R 33/5611 |
| | | | 324/309 |
| 2011/0148410 A1* | 6/2011 | Zaitsev | G01R 33/5611 |
| | | | 324/309 |
| 2011/0241678 A1* | 10/2011 | Weber | G01R 33/4833 |
| | | | 324/309 |
| 2013/0099786 A1* | 4/2013 | Huang | G01R 33/246 |
| | | | 324/309 |
| 2013/0285662 A1 | 10/2013 | Takeshima | |
| 2014/0077801 A1 | 3/2014 | Riederer et al. | |
| 2014/0079305 A1 | 3/2014 | Akcakaya et al. | |
| 2014/0086469 A1* | 3/2014 | Lefebvre | G06T 11/005 |
| | | | 382/131 |
| 2014/0126796 A1* | 5/2014 | Chesneau | G01R 33/4824 |
| | | | 382/131 |
| 2016/0033600 A1* | 2/2016 | Lee | G01R 33/561 |
| | | | 324/309 |
| 2019/0154784 A1* | 5/2019 | Polak | G01R 33/5617 |

FOREIGN PATENT DOCUMENTS

| | | |
|---|---|---|
| KR | 10-2013-0071572 A | 7/2013 |
| KR | 10-2014-0043655 A | 4/2014 |

OTHER PUBLICATIONS

Communication dated Mar. 27, 2018, issued by the European Patent Office in counterpart European Application No. 15828020.6.

Breuer, et al., "Controlled aliasing in volumetric parallel imaging (2D CAIPIRINHA)", Jan. 11, 2006, Magnetic Resonance in Medicine, vol. 55, No. 3, XP055133400, 8 pages total.

Wu, et al., "Improved matrix inversion in image plane parallel MRI", Sep. 1, 2009, Magnetic Resonance Imaging, vol. 27, No. 7, XP026467800, 12 pages total.

Breuer, et al., "Zigzag sampling for improved parallel imaging", Jul. 29, 2008, Magnetic resonance in medicine, vol. 60, No. 2, XP055459346, 6 pages total.

International Search Report for PCT/KR2015/007937 dated Nov. 5, 2015 [PCT/ISA/210].

Written Opinion for PCT/KR2015/007937 dated Nov. 5, 2015 [PCT/ISA/237].

Communication from the Korean Intellectual Property Office dated Nov. 11, 2015 in a counterpart Korean application No. 10-2014-97619.

* cited by examiner (a)   (b)

(a)   (b)

APPARATUS AND METHOD FOR GENERATING MAGNETIC RESONANCE IMAGE

CROSS-REFERENCE TO RELATED APPLICATION

This application claims priority from Korean Patent Application No. 10-2014-0097619, filed on Jul. 30, 2014 in the Korean Intellectual Property Office, the disclosure of which is incorporated herein in its entirety by reference.

BACKGROUND

1. Field

Apparatuses and methods consistent with one or more exemplary embodiments relate to magnetic resonance imaging (MRI) apparatuses and methods, and more particularly, to MRI apparatuses and methods for determining a sampling pattern in k-space.

2. Description of the Related Art

A magnetic resonance imaging (MRI) apparatus captures an image of a subject by using a magnetic field, and is widely used to precisely diagnose diseases due to its stereoscopic view of bones, disks, joints, nerves, ligaments, or the like, at a desired angle. An MRI image may be obtained by sampling a magnetic resonance (MR) signal to obtain digital data in k-space and generating image data based on the obtained digital data.

Recently, research is being conducted into a method of improving quality of an MRI image without increasing a time taken to acquire the MRI image.

SUMMARY

One or more exemplary embodiments include a magnetic resonance imaging (MRI) apparatus and method, in which an optimized sampling pattern in k-space may be determined.

Additional aspects will be set forth in part in the description which follows and, in part, will be apparent from the description, or may be learned by practice of the presented exemplary embodiments.

According to an aspect of an exemplary embodiment, a magnetic resonance imaging (MRI) apparatus includes: a radio frequency (RF) coil configured to receive a magnetic resonance (MR) signal emitted from an object; a sampling pattern determiner configured to determine a sampling pattern of k-space based on a sensitivity of the RF coil and signal region information which is information about a signal region where the MR signal is generated; and a digital data obtainer configured to obtain digital data of the k-space by sampling the MR signal based on the determined sampling pattern.

The digital data obtainer may be configured to obtain an aliasing image based on the digital data, the aliasing image including an image of interest which is an image of the signal region and an aliasing artifact, and the sampling pattern determiner may be configured to determine the sampling pattern from among a plurality of candidate sampling patterns such that a correlation between an interest sensitivity pattern which is a pattern of the sensitivity of the RF coil in the image of interest and an aliasing sensitivity pattern which is a pattern of the sensitivity of the RF coil in the aliasing artifact is a minimum correlation among a plurality of correlations.

The plurality of candidate sampling patterns may include a first sampling pattern in which the digital data is obtained from a sampling line in an axis direction in the k-space and a second sampling pattern in which the digital data is obtained in a zigzag shape in the k-space.

The digital data obtainer may be configured to change a field of view (FOV) to a logical FOV, and obtain the digital data in logical k-space corresponding to the logical FOV.

The digital data obtainer may be configured to obtain the logical FOV by rotating the FOV, and may be configured to obtain the digital data from a sampling line in an axis direction of the logical k-space.

The digital data obtainer may be configured to obtain the logical FOV by changing a size of the FOV based on the signal region.

The digital data obtainer may be configured to obtain an MR image by removing the aliasing artifact from the aliasing image, and the MRI apparatus may further include an outputter configured to display the MR image based on the logical FOV or based on the FOV.

The MRI apparatus may further include an inputter configured to receive information used to set the FOV.

The MRI apparatus may further include an inputter configured to receive input indicating approval of the determined sampling pattern.

The RF coil may include a plurality of channel coils, and the sensitivity of the RF coil may be based on a sensitivity of each of the plurality of channel coils.

The digital data obtainer may be configured to obtain digital data of each of a plurality of k-spaces by sampling an MR signal received with respect to each of the plurality of channel coils, according to the determined sampling pattern.

According to an aspect of another exemplary embodiment, a method of generating a magnetic resonance imaging (MRI) image includes: determining a sampling pattern of k-space based on a sensitivity of an RF coil and signal region information which is information about a signal region where a magnetic resonance (MR) signal is generated; and obtaining digital data of the k-space by sampling the MR signal based on the determined sampling pattern.

The method may include obtaining an aliasing image by performing Fourier transformation (FT) on the digital data of the k-space, the aliasing image including an image of interest which is an image of the signal region and an aliasing artifact, and the determining of the sampling pattern may include determining the sampling pattern from among a plurality of candidate sampling patterns such that a correlation between an interest sensitivity pattern which is a pattern of the sensitivity of the RF coil in the image of interest and an aliasing sensitivity pattern which is a pattern of the sensitivity of the RF coil in the aliasing artifact is a minimum correlation among a plurality of correlations.

The plurality of candidate sampling patterns may include a first sampling pattern in which the digital data is obtained from a sampling line in an axis direction in the k-space and a second sampling pattern in which the digital data is obtained in a zigzag shape in the k-space.

The method may further include: adjusting a filed of view (FOV) to change the FOV to a logical FOV; and obtaining the digital data in logical k-space corresponding to the logical FOV.

The adjusting of the FOV may include rotating the FOV, and the obtaining of the digital data may include obtaining the digital data from a sampling line in an axis direction of the logical k-space.

The method may further include: receiving information for setting the FOV; and receiving approval of the determined sampling pattern from the user.

The RF coil may include a plurality of channel coils, and sensitivity of the RF coil may be based on a sensitivity of each of the plurality of channel coils.

The obtaining of the digital data may include obtaining the digital data with respect to each of a plurality of k-spaces by sampling an MR signal received with respect to each of the plurality of channel coils, by using the determined sampling pattern.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
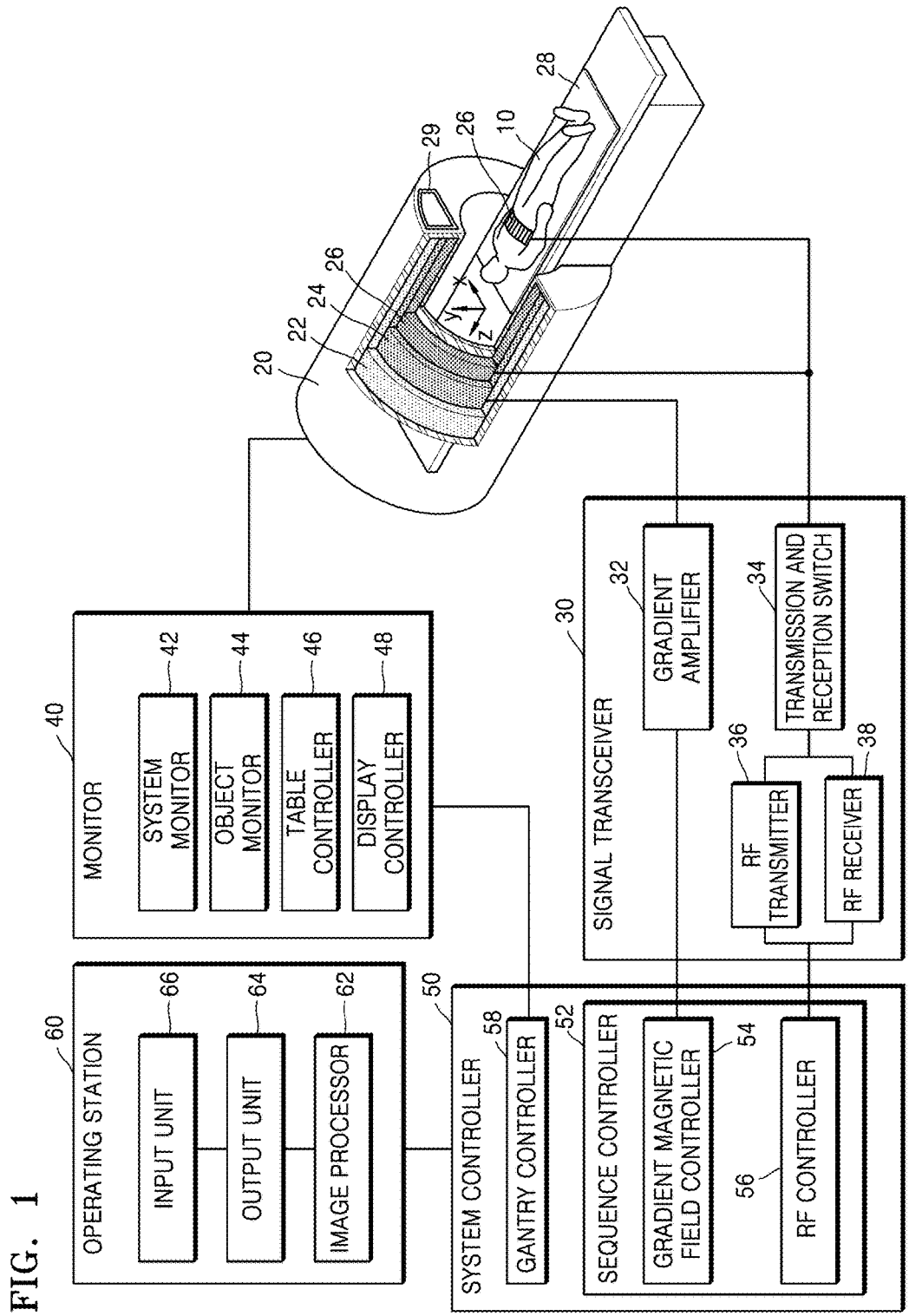
FIG. 1 is a block diagram of a general magnetic resonance imaging (MRI) system.

The attached drawings for illustrating exemplary embodiments of the present disclosure are referred to in order to gain a sufficient understanding of the exemplary embodiments, the merits thereof, and the objectives accomplished by the implementation thereof. The exemplary embodiments may, however, be embodied in many different forms and should not be construed as being limited to the exemplary embodiments set forth herein; rather, these exemplary embodiments are provided such that this disclosure will be thorough and complete, and will fully convey the concept of the exemplary embodiments to one of ordinary skill in the art.

Hereinafter, the terms used in the specification will be briefly described, and then the exemplary embodiments will be described in detail.

The terms used in this specification are those general terms currently widely used in the art in consideration of functions regarding the exemplary embodiments, but the terms may vary according to the intention of those of ordinary skill in the art, precedents, or new technology in the art. Also, some terms may be arbitrarily selected by the applicant, and in this case, the meaning of the selected terms will be described in detail in the detailed description of the present specification. Thus, the terms used in the present specification should be understood not as simple names, but rather should be understood based on the meaning of the terms and the overall description of the exemplary embodiments.

When a part "includes" or "comprises" an element, unless there is a particular description contrary thereto, the part can further include other elements, not excluding the other elements. Also, the term "unit" in the exemplary embodiments refers to a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to exemplary embodiments, examples of which are illustrated in the accompanying drawings. In the following description, well-known functions or constructions are not described in detail so as not to obscure the exemplary embodiments with unnecessary detail.

According to an exemplary embodiment, an "image" may denote multi-dimensional data composed of discrete image elements (for example, pixels in a two-dimensional image and voxels in a three-dimensional image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, according to an exemplary embodiment, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom refers to a material having a density, an effective atomic number, and a volume that are approximately the same as those of an organism. For example, the phantom may be a spherical phantom having properties similar to the human body.

Furthermore, according to an exemplary embodiment, a "user" may be, but is not limited to being, a medical expert, such as a medical doctor, a nurse, a medical laboratory technologist, or a technician who repairs a medical apparatus.

Furthermore, according to an exemplary embodiment, an "MR image" refers to an image of an object obtained by using the nuclear magnetic resonance principle.

Furthermore, according to an exemplary embodiment, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, according to an exemplary embodiment, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

An MRI system is an apparatus for acquiring a sectional image of a part of an object by expressing, in a contrast comparison, a strength of an MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus, the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI systems include characteristics different from those of other types of imaging apparatuses. Unlike imaging apparatuses such as CT apparatuses that acquire images according to a direction of detection hardware, MRI systems may acquire 2D images or 3D volume images that are oriented toward a desired point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capture images of abnormal tissues.

FIG. 1 is a block diagram of a general MRI system. Referring to FIG. 1, the general MRI system may include a gantry 20, a signal transceiver 30, a monitoring unit 40 (e.g., monitor), a system control unit 50 (e.g., system controller), and an operating unit 60 (e.g., operating station).

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Larmor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei included in the object 10.

The RF coil 26 may be realized as a single RF transmitting and receiving coil having both a function of generating electromagnetic waves that each have an RF that corresponds to a type of an atomic nucleus and a function of receiving electromagnetic waves emitted from an atomic nucleus. Alternatively, the RF coil 26 may be realized as a transmission RF coil having a function of generating electromagnetic waves that each have an RF that corresponds to a type of an atomic nucleus, and a separate reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil configured for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may communicate with an external apparatus via wires and/or wirelessly, and may also perform dual tune communication according to a communication frequency band.

The RF coil 26 may be exclusively a transmission coil, exclusively a reception coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, e.g., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Larmor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit 42 (e.g., system monitor), an object monitoring unit 44 (e.g., object monitor), a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during imaging of the object 10 when the object 10 is in motion, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display disposed inside the gantry 20 to be on or off, and may control a screen image to be output on the display 29 and the display disposed inside the gantry 20. Also, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. According to an exemplary embodiment, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system.

The operating unit 60 may include an image processor 62 for receiving and processing the MR signal received by the RF receiver 38, an output unit 64 (e.g., outputter), and an input unit 66 (e.g., inputter).

The image processor 62 may process the MR signal received from the RF receiver 38 so as to generate MR image data of the object 10.

The image processor 62 receives the MR signal received by the RF receiver 38 and performs any one of various signal processing operations, such as amplification, frequency transformation, phase detection, low frequency amplification, and filtering, on the received MR signal.

The image processor 62 may arrange digital data in a k space (for example, a Fourier space or a frequency space) of a memory, and rearrange the digital data into image data via 2D or 3D Fourier transformation.

The image processor 62 may perform a composition process or difference calculation process on image data. The composition process may include an addition process on a pixel or a maximum intensity projection (MIP) process. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information to be used by the user to manipulate the MRI system, such as a user interface (UI), user information, or object information. The output unit 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input unit 66. The input unit 66 may be a keyboard, a mouse, a track ball, a voice recognizer, a gesture recognizer, a touch screen, or any one of various other types of input devices that are well known to one of ordinary skill in the art.

The signal transceiver 30, the monitoring unit 40, the system control unit 50, and the operating unit 60 are separate components in FIG. 1, but it would be appreciated by one of ordinary skill in the art that respective functions of the signal transceiver 30, the monitoring unit 40, the system control unit 50, and the operating unit 60 may be performed by another component. For example, the image processor 62 shown in FIG. 1 may convert the MR signal received from the RF receiver 38 into a digital signal, or alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when the components are connected wirelessly, the MRI system may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various other types of communication methods that are well known to one of ordinary skill in the art.

Figure 2:
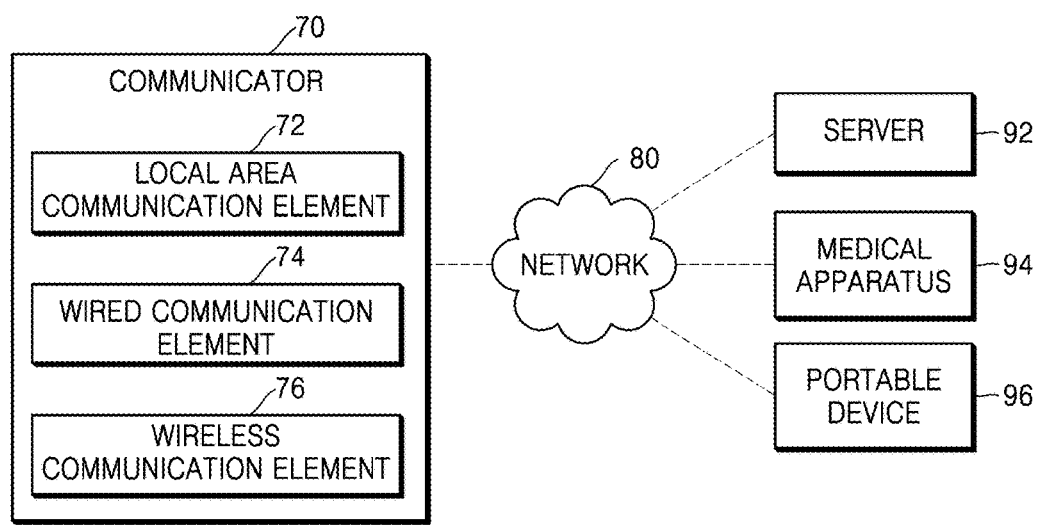
FIG. 2 illustrates a structure of a communication unit.

FIG. 2 is a block diagram of a communication unit 70 (e.g., communicator) according to an exemplary embodiment. Referring to FIG. 2, the communication unit 70 may be connected to at least one selected from the gantry 20, the signal transceiver 30, the monitoring unit 40, the system control unit 50, and the operating unit 60 of FIG. 1.

The communication unit 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 2, the communication unit 70 may be connected to a network 80 by wire or wirelessly to communicate with a server 92, a medical apparatus 94, or a portable device 96.

In detail, the communication unit 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication unit 70 may receive a diagnosis history or a treatment schedule of the object from the server 92 and use the same to diagnose the object. The communication unit 70 may perform data communication not only with the server 92 or the medical apparatus 94 in a hospital, but also with the portable device 96, such as a mobile phone, a personal digital assistant (PDA), or a laptop of a doctor or patient.

Also, the communication unit 70 may transmit information about a malfunction of the MRI system or about a medical image quality to a user through the network 80, and receive feedback regarding the information from the user.

The communication unit 70 may include at least one component enabling communication with an external apparatus.

For example, the communication unit 70 may include a local area communication element 72, a wired communication element 74, and a wireless communication element 76.

The local area communication module 72 refers to a module for performing local area communication with an apparatus within a predetermined distance. Examples of local area communication technology according to an exemplary embodiment include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication element 74 refers to a module for performing communication by using an electric signal or an optical signal. Examples of wired communication technology according to an exemplary embodiment include wired communication techniques using a pair cable, a coaxial cable, and an optical fiber cable, and other well known wired communication techniques.

The wireless communication module 76 transmits and receives a wireless signal to and from at least one entity selected from a base station, an external apparatus, and a server in a mobile communication network. According to an exemplary embodiment, the wireless signal may be a voice call signal, a video call signal, or data in any one of various formats according to transmission and reception of a text or multimedia message.

Figure 3:
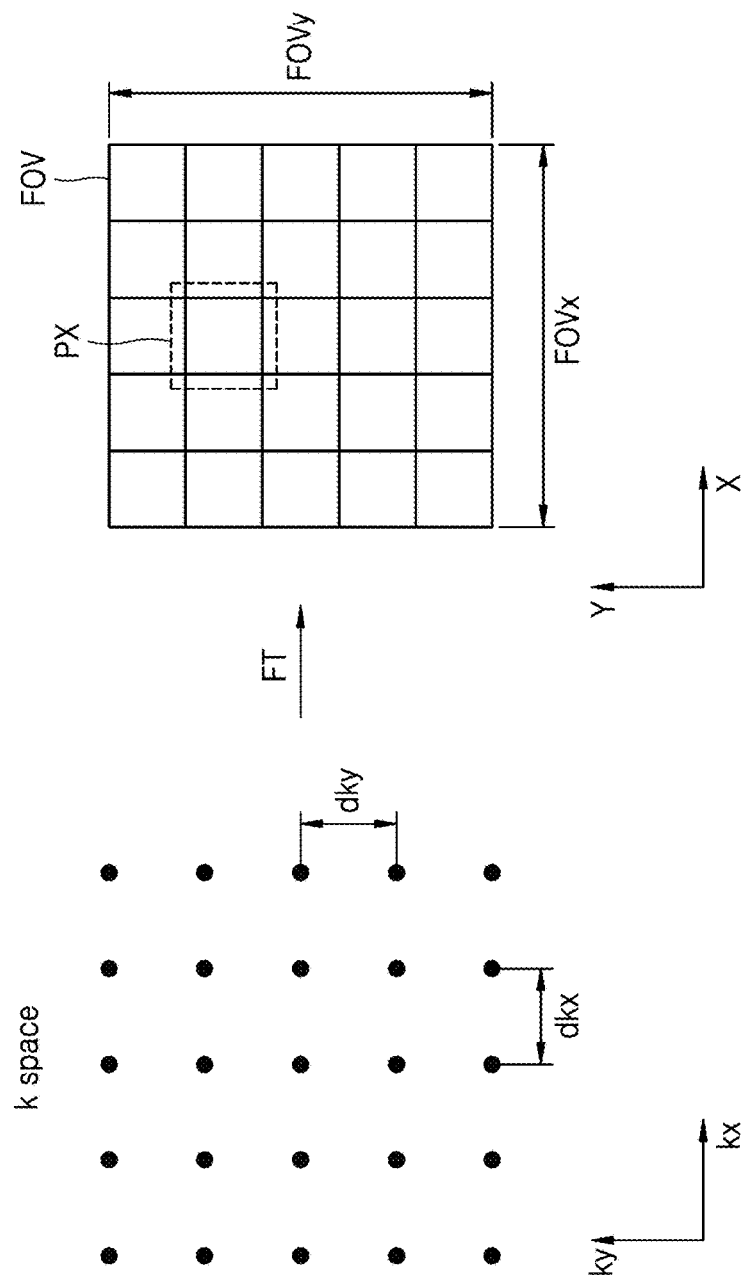
FIG. 3 illustrates k-space and a field of view (FOV)

FIG. 3 illustrates k-space and a field of view (FOV).

Referring to FIG. 3, k-space may be expressed in a kx-ky coordinate system, and a FOV, which is image space, may be expressed in an X-Y coordinate system.

In k-space, a kx-axis direction is also referred to as a read out direction, and a ky-axis direction is also referred to as a phase direction. As illustrated with dots, digital data is arranged in a matrix in k-space. Digital data in k-space is obtained by sampling an MR signal. A position of digital data illustrated with dots in k-space may be expressed by (kx, ky). For example, a position of digital data at the center of the k-space may be expressed by (0, 0).

A FOV includes a plurality of pixels PX in a matrix. A resolution may be defined by the number of pixels or a size of a matrix of pixels in a FOV. Thus, a size of pixels in a FOV may vary according to resolution. A resolution of a FOV in FIG. 3 is 5×5, although it is understood that the resolution may be greater or less than 5×5. Each pixel PX of a FOV may correspond to a pixel value, and as each pixel expresses a corresponding pixel value, an MR image may be displayed in the FOV. Pixel values of pixels denote image data, and image data may be obtained by performing Fourier transformation (FT) on digital data in k-space.

A sampling distance (dkx, dky) in k-space is inversely proportional to a FOV size (FOVx, FOVy). In k-space, the number of samples (Nx) in the read out direction kx and the number of samples (Ny) in the phase direction ky may be determined according to resolution. For example, if the numbers of samples Nx and Ny increase, the number of pixels in a FOV increases and a pixel size is reduced. The smaller a pixel size, the clearer an MR image may be. Although the numbers of samples Nx and Ny are each five in the read out direction kx and the phase direction ky, FIG. 3 is merely exemplary and the exemplary embodiments are not limited thereto.

Acquiring all digital data in the read out direction kx and the phase direction ky in k-space as illustrated in FIG. 3 is referred to as full sampling. In full sampling, however, a time for obtaining images increases, and an error may be caused in an MR image due to movement of the object 10 (see FIG. 1). Thus, instead of full sampling, digital data of k-space may be obtained by undersampling, which reduces a time for obtaining images. A sampling pattern refers to a pattern in which a digital pattern is arranged in k-space.

Figure 4:
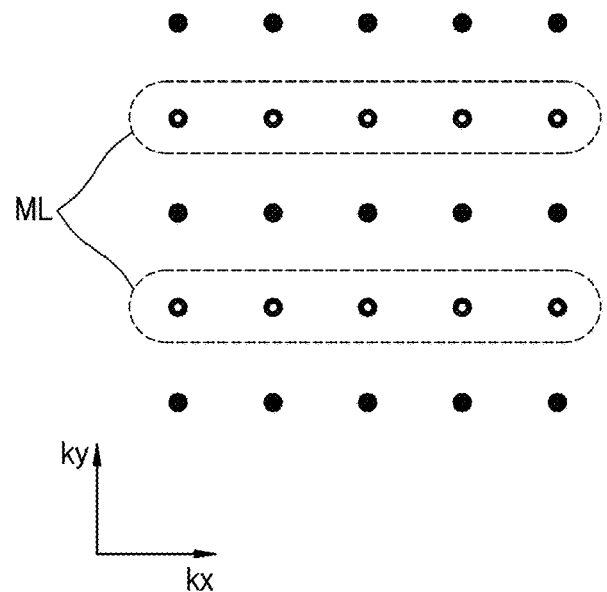
FIGS. 4 and 5 respectively illustrate a sampling pattern.
Figure 5:
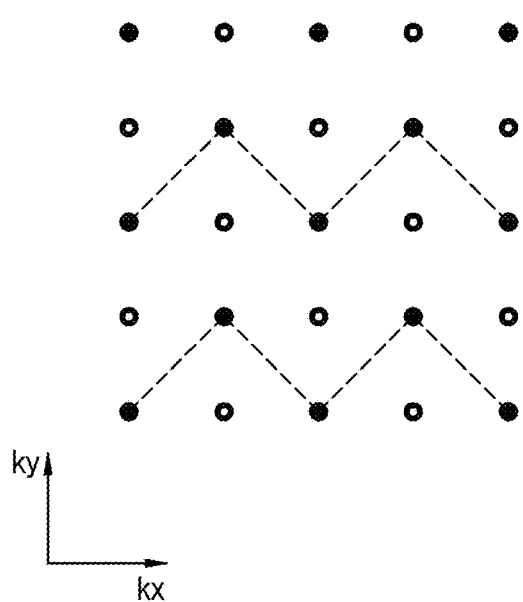

FIGS. 4 and 5 respectively illustrate a sampling pattern.

Referring to FIG. 4, digital data is obtained only from some of the sampling lines in the phase direction ky in k-space. Thus, there are missing lines ML from which no digital data is obtained. In FIG. 4, missing lines ML are alternately disposed among the sampling lines in the phase direction ky.

Referring to FIG. 5, a track of digital data sampled in the read out direction kx is in a zigzag shape.

FIGS. 4 and 5 are simply examples of sampling patterns, and digital data may be obtained in k-space by also using another sampling pattern.

Hereinafter, a sampling pattern according to which digital data is obtained only from some of sampling lines in any one axis direction in k-space as illustrated in FIG. 4 may also be referred to as a first sampling pattern, for convenience of description. Also, a sampling pattern according to which digital data is obtained in a zigzag shape in any one axis direction in k-space as illustrated in FIG. 5 may also be referred to as a second sampling pattern. However, the first and second sampling patterns are not limited to the patterns shown in FIGS. 4 and 5.

When obtaining digital data of k-space by undersampling as illustrated in FIGS. 4 and 5, an aliasing artifact occurs in image data. The aliasing artifact will be described later.

Figure 6:
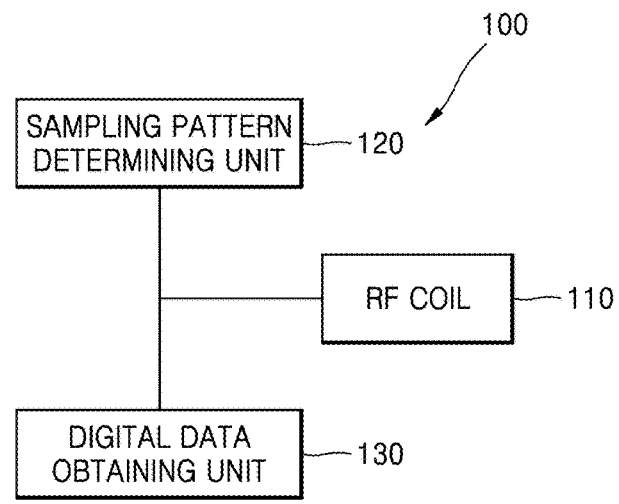
FIG. 6 illustrates an MRI apparatus according to an exemplary embodiment.

FIG. 6 illustrates a magnetic resonance imaging (MRI) apparatus 100 according to an exemplary embodiment.

Referring to FIG. 6, the MRI apparatus 100 includes an RF coil 110, a sampling pattern determining unit 120, and a digital data obtaining unit 130. The MRI apparatus 100 may be the MRI system (see FIG. 1) or may be included in the MRI system of FIG. 1. For example, the RF coil 110 may correspond to the RF coil 26 of FIG. 1, and the sampling pattern determining unit 120 (e.g., sampling pattern determiner) and the digital data obtaining unit 130 (e.g., digital data obtainer) may be included in the image processor 62 (see FIG. 1). Thus, the description provided above with reference to FIG. 1 will not be repeated.

The RF coil 110 receives an MR signal emitted from an object.

The sampling pattern determining unit 120 determines a sampling pattern of k-space based on sensitivity of the RF coil 110 and signal region information which is information about a signal region where an MR signal is generated in the object 10 (see FIG. 1). The signal region may correspond to a cross-section displayed as an MR image in the object 10 (see FIG. 1). Sensitivity of the RF coil 110 refers to reception sensitivity of an RF coil.

The digital data obtaining unit 130 samples an MR signal based on the determined sampling pattern to obtain digital data of k-space. By performing FT on the digital data of k-space, image data may be obtained.

Before obtaining digital data by using the digital data obtaining unit 130, a user may be requested to select whether the sampling pattern determined by the sampling pattern determining unit 110 is approved or not. Information for requesting whether the determined sampling pattern is approved or not may be output to the output unit 64 (see FIG. 1). The user may input information indicating whether the determined sampling pattern is approved or not, via the input unit 66 (see FIG. 1). When the determined sampling pattern is approved by the user, digital data is obtained according to the determined sampling pattern by the data obtaining unit 130. If the request for approval is declined or information that indicates approval is not input by the user for a preset time period, the sampling pattern determining unit 110 may determine a sampling pattern again.

Figure 7:
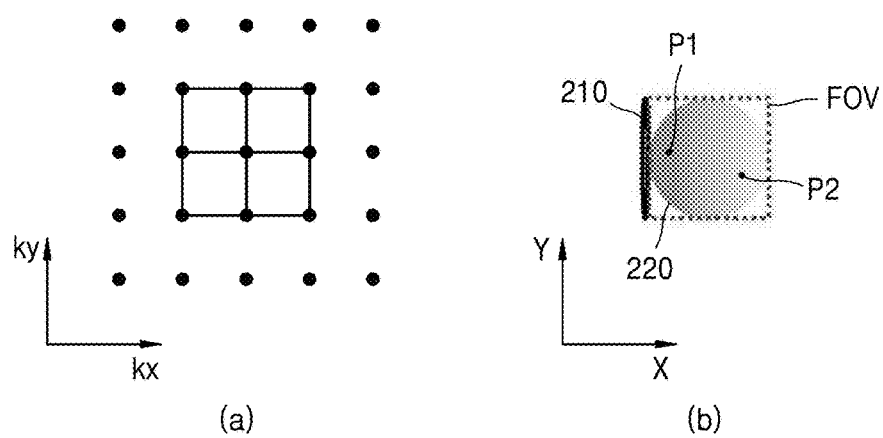
FIGS. 7, 8, 9, 10, 11 and 12 illustrate a method of determining a sampling pattern in k-space by using a sampling pattern determining unit, according to exemplary embodiments.
Figure 8:
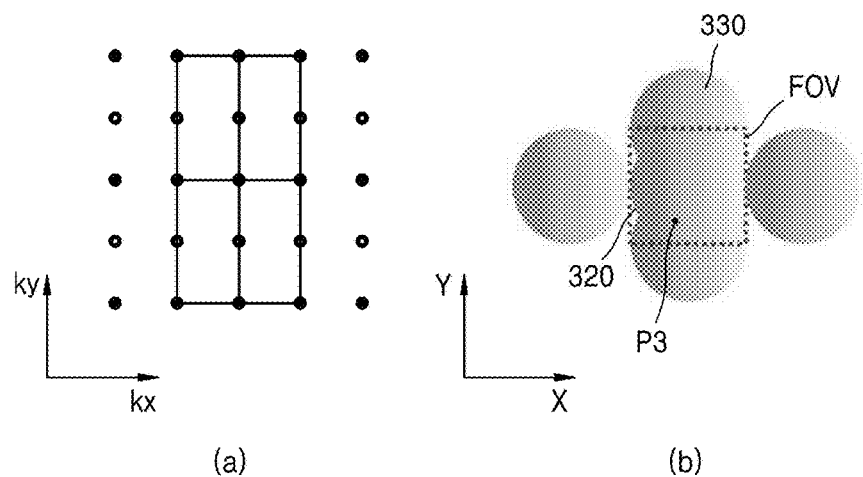
Figure 9:
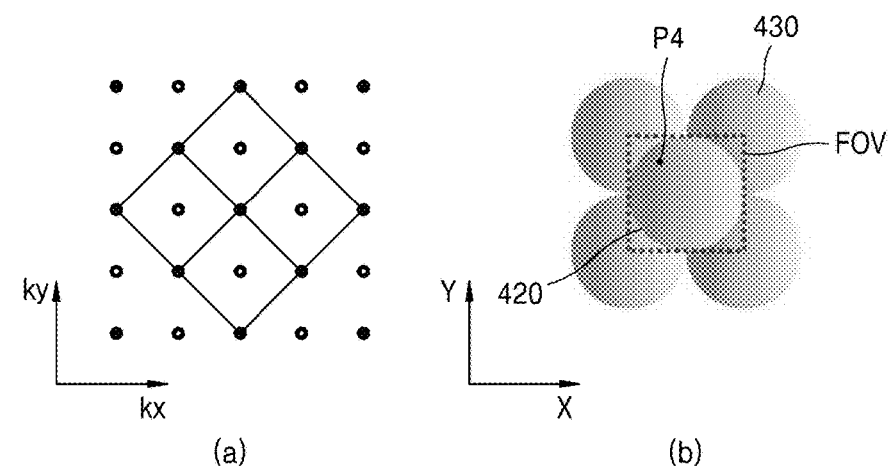
Figure 10:
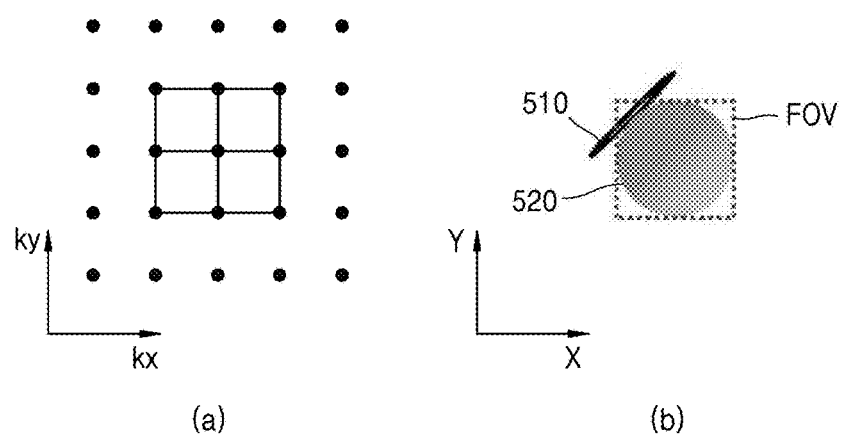
Figure 11:
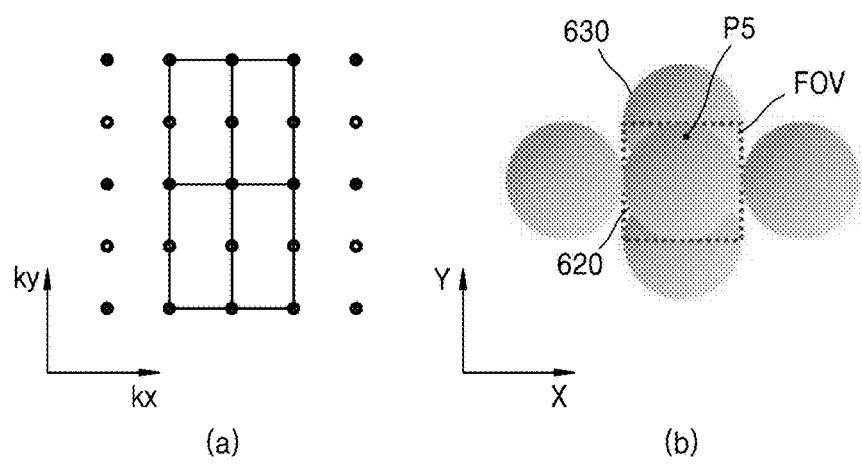
Figure 12:
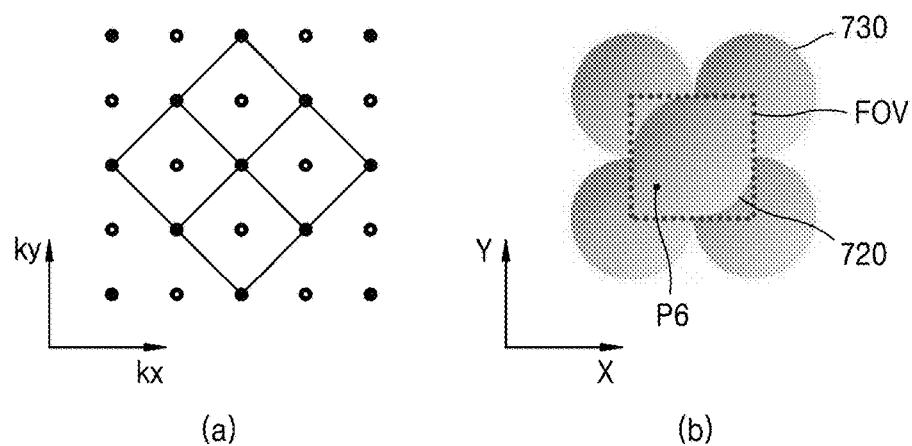

FIGS. 7, 8, 9, 10, 11 and 12 illustrate a method of determining a sampling pattern in k-space by using the sampling pattern determining unit 110 (see FIG. 6), according to an exemplary embodiment. FIGS. 7 through 9 illustrate that the RF coil 210 (see FIG. 7) is located on the left side of a FOV and is parallel to a Y-axis direction, and FIGS. 10 through 12 illustrate that a RF coil 510 (see FIG. 10) is located on the left side of a FOV and is inclined with respect to an X-axis. For convenience of description, coil geometry of the RF coil 210 in FIGS. 7 through 9 is referred to as first coil geometry, and coil geometry of the RF coil 510 in FIGS. 10 through 12 is referred to as second coil geometry.

(a) of FIGS. 7 through 12 respectively illustrate sampling patterns in k-space. (b) of FIGS. 7 through 12 respectively illustrate sensitivity patterns of an RF coil shown in an image obtained by using the sampling patterns of (a) of FIGS. 7 through 12.

(a) of FIG. 7 illustrates k-space in which digital data is obtained according to a full sampling pattern.

Referring to (b) of FIG. 7, in an image of interest within an FOV, a sensitivity pattern 220 of the RF coil 210 is indicated by a gray level. The image of interest is an image of a signal region where an MR signal is generated in the object 10 (see FIG. 1). In (b) of FIG. 7, as the sensitivity increases, the sensitivity pattern 220 becomes darker, and as the sensitivity decreases, the sensitivity pattern 220 becomes brighter. A gray level of a point P1 is higher than that of a point P2. That is, sensitivity of the RF coil 210 at the point P1 is higher than that of the RF coil 210 at the point P2. As the RF coil 210 becomes closer to a signal region, the sensitivity of the RF coil 210 becomes higher. Sensitivity here refers to reception sensitivity, and thus, as the gray level in the sensitivity pattern 220 becomes higher, the reception sensitivity of the RF coil 210 becomes better.

(a) of FIG. 8 illustrates k-space in which digital data is obtained according to the first sampling pattern. The first sampling pattern is described above with reference to FIG. 4, and thus a description thereof will not be repeated here.

In (b) of FIG. 8, an interest sensitivity pattern 320 which is a sensitivity pattern of the RF coil 210 (see FIG. 7) in an image of interest and an aliasing sensitivity pattern 330 which is a sensitivity pattern of the RF coil 210 in an aliasing artifact are indicated by a gray level. Digital data is not obtained in some of sampling lines in the phase direction ky in the first sampling pattern, and thus an aliasing artifact occurs in a Y direction in an image in the FOV.

The interest sensitivity pattern 320 and the aliasing sensitivity pattern 330 are identical at a point P3 where the image of interest and aliasing artifacts overlap. While the one point P3 is described as an example, the interest sensitivity pattern 320 and the aliasing sensitivity pattern 330 are also not distinguished from each other at other points where the image of interest and the aliasing artifacts overlap, besides the point P3. That is, a correlation between the interest sensitivity pattern 320 and the aliasing sensitivity pattern 330 is high.

(a) of FIG. 9 illustrates k-space in which digital data is obtained according to the second sampling pattern. The second sampling pattern is described above with reference to FIG. 5, and thus a description thereof will not be repeated here.

In (b) of FIG. 9, some pieces of digital data are not obtained both in the read out direction kx and the phase direction ky in the second sampling pattern, and thus an aliasing artifact occurs in an X direction and a Y direction in an image in the FOV.

An interest sensitivity pattern 420 and an aliasing sensitivity pattern 430 are distinguished at a point P4 where an image of interest and aliasing artifacts overlap. Sensitivity of the image of interest at the point P4 is high but a sensitivity pattern of the aliasing artifact is low. That is, a correlation between the interest sensitivity pattern 420 and the aliasing sensitivity pattern 430 is low.

As illustrated in FIGS. 8 and 9, when digital data of k-space is obtained by undersampling, an image obtained by performing FT on digital data may be an aliasing image including an image of interest and an aliasing artifact. In order to perform image processing such that only an image of interest is left after removing an aliasing artifact from an aliasing image, a low correlation between the interest sensitivity pattern and the aliasing sensitivity pattern is preferred. Thus, the example of FIG. 9 is more suitable for generating an MR image, among the examples of FIGS. 8 and 9. In other words, in regard to the first coil geometry as illustrated in FIGS. 7 through 9, the second sampling pattern is more suitable for generating an MR image than the first sampling pattern.

FIGS. 10 through 12 illustrate a sampling pattern and a sensitivity pattern of the RF coil 510 having the second coil geometry.

Referring to FIG. 10, a geometry of the RF coil 510 is different from a geometry of the RF coil 220 of FIGS. 7 through 9, and thus, a sensitivity pattern 520 of the RF coil 510 displayed by a gray level is different from the exemplary embodiment of FIG. 7. However, similar to FIG. 7, as the RF coil 510 becomes closer to a signal region, the sensitivity becomes higher.

Referring to FIG. 11, an interest sensitivity pattern 620 and an aliasing sensitivity pattern 630 are distinguished at a point P5. That is, a correlation between the interest sensitivity pattern 620 and the aliasing sensitivity pattern 630 is low.

Referring to FIG. 12, an interest sensitivity pattern 720 and an aliasing sensitivity pattern 730 are identical at a point P6. That is, a correlation between the interest sensitivity pattern 720 and the aliasing sensitivity pattern 730 is high.

In regard to the second coil geometry as illustrated in FIGS. 10 through 12, the first sampling pattern is more suitable for generating an MR image than the second sampling pattern.

Thus, the second sampling pattern is more suitable for generating an MR image in FIGS. 7 through 9, whereas the first sampling pattern is more suitable for generating an MR image in FIGS. 10 through 12.

As in the exemplary embodiments described above, a sampling pattern may be determined such that a correlation between an interest sensitivity pattern and an aliasing sensitivity pattern is the lowest based on sensitivity of an RF coil and signal region information. In other words, the sampling pattern determining unit 120 (see FIG. 6) may determine a sampling pattern among a plurality of candidate sampling patterns such as the first sampling pattern and the second sampling pattern. An aliasing image obtained based on candidate sampling patterns may include an image of interest and an aliasing artifact. A sampling pattern may be determined such that a correlation between an interest sensitivity pattern and an aliasing sensitivity pattern is the lowest among candidate sampling patterns. In this case, an optimized sampling pattern may be obtained, and generating an MR image may be efficiently performed. This result is because, although the time taken to obtain images is reduced due to undersampling, image quality may be improved by selecting an optimized sampling pattern. That is, according to some exemplary embodiments, an MRI apparatus and method are provided, which are efficient in that a quality of an MRI image is improved without increasing a time taken to obtain the MRI image.

In some exemplary embodiments, a user may input image parameter information such as an FOV or resolution via the input unit 66. However, a sampling pattern is determined not based on image parameters set by the user but based on sensitivity of an RF coil and signal region information.

Hereinafter, an operation of the digital data obtaining unit 130 (see FIG. 6), that is, a method of obtaining digital data of k-space based on a determined sampling pattern according to exemplary embodiments will be described.

Digital data of k-space may be obtained by applying a gradient waveform based on a determined sampling pattern. For example, in the first sampling pattern (FIG. 4), a gradient magnetic field corresponding to missing lines is not applied.

Digital data of k-space according to the second sampling pattern (see FIG. 5) may be obtained by gradient modulation. For example, by modifying encoding of a gradient magnetic field, digital data of k-space according to the second sampling pattern (see FIG. 5) may be obtained. Alternatively, besides gradient modulation, digital data according to the second sampling pattern may be obtained by modifying a sampling order or modifying relatively simple logical coordinates such as adjustment of an FOV, tilt sampling, or undersampling.

Hereinafter, changing a logical coordinate system by adjusting an FOV will be described.

Figure 13:
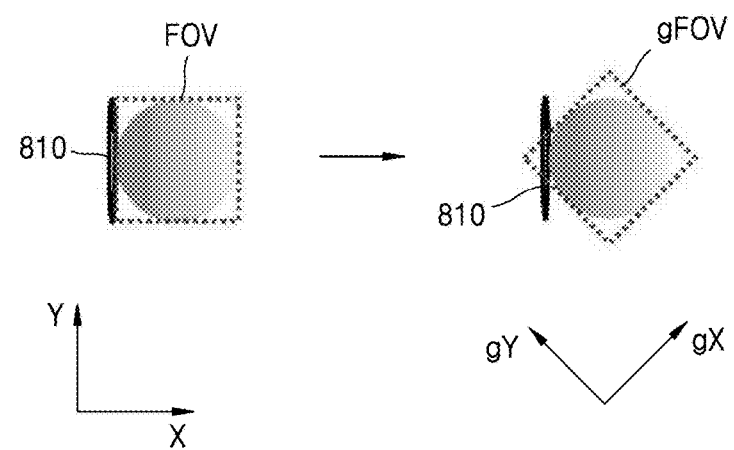
FIGS. 13 and 14 illustrate a logical FOV and logical k-space generated by adjusting a FOV according to exemplary embodiments.
Figure 14:
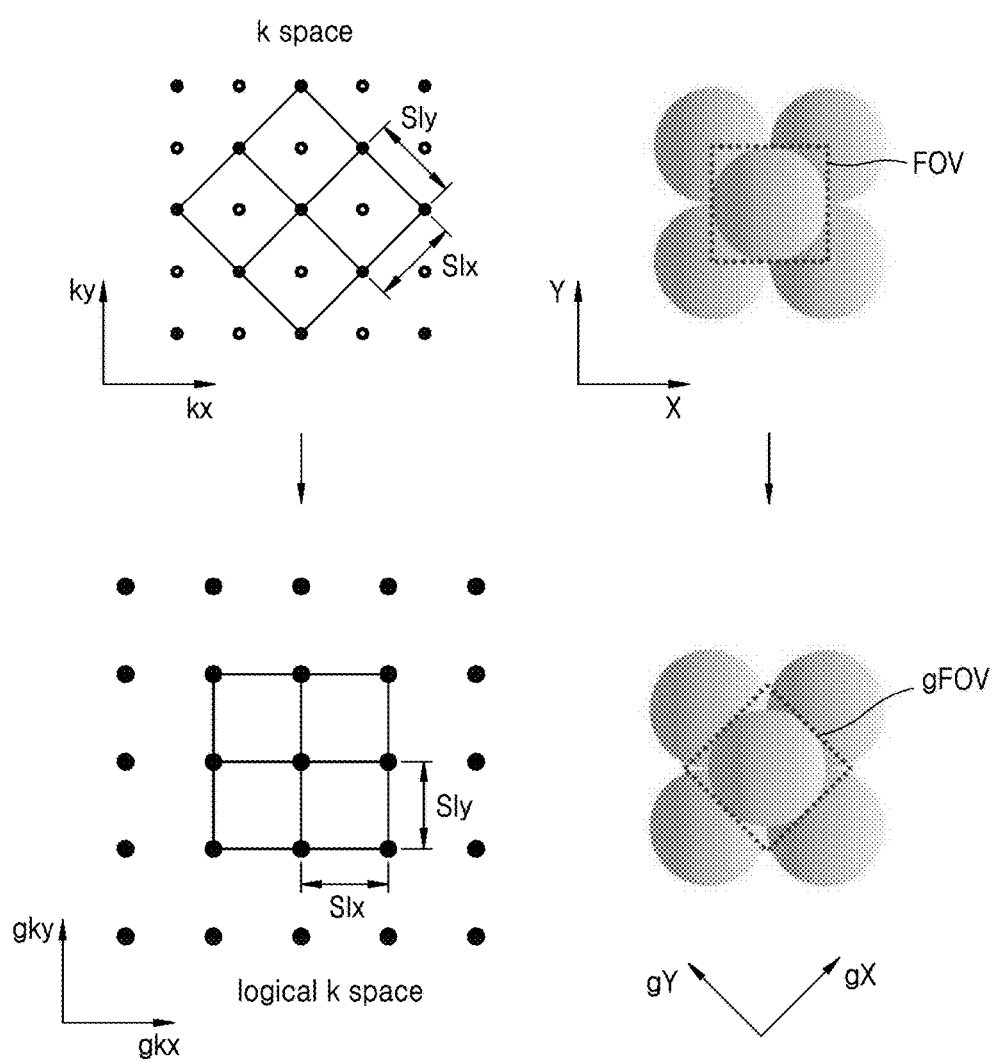

FIGS. 13 and 14 illustrate a logical FOV and logical k-space generated by adjusting an FOV according to exemplary embodiments. FIG. 13 illustrates an example of rotating a FOV in the first coil geometry (FIGS. 7 through 9).

Referring to FIG. 13, a FOV may be adjusted to a logical FOV (gFOV) by rotating the FOV. According to rotation of a FOV, coordinates (X, Y) are also rotated to logical coordinates (gX, gY). The FOV before adjustment may be set based on a user input. The digital data obtaining unit 130 (see FIG. 6) may change an FOV to a logical FOV (gFOV). As described above, in the case of the first coil geometry, it is efficient to obtain digital data of k-space by using the second sampling pattern (FIG. 9).

Referring to FIG. 14, if an FOV is adjusted to a logical FOV (gFOV) by rotating the FOV, k-space is also rotated to logical k-space corresponding to the logical FOV. Accordingly, coordinates (kx, ky) of k-space are also rotated to logical coordinates (gkx, gky) of k-space.

While the second sampling pattern is a zigzag shape in k-space, the second sampling pattern in logical k-space is sampled according to a sampling interval Slx in a logical readout direction gkx and a sampling interval Sly in a logical phase direction gky. Referring to FIG. 14, a size of the logical k-space is different from a size of k-space. That is, by adjusting the FOV, the size of the k-space may be changed.

When an FOV is rotated as illustrated in FIGS. 13 and 14, a gradient wave is applied without modifying a gradient, thereby obtaining digital data of k-space. That is, k-space digital data may be obtained using the second sampling pattern by simple FOV adjustment such as FOV rotation.

Figure 15:
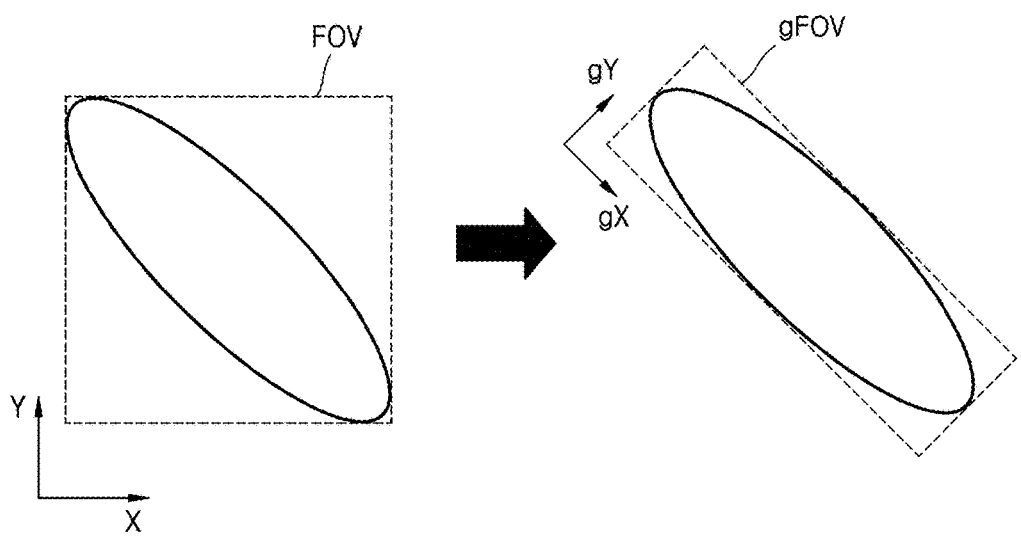
FIG. 15 illustrates adjustment of a FOV according to another exemplary embodiment.

FIG. 15 illustrates adjustment of an FOV according to another exemplary embodiment.

Referring to FIG. 15, as an FOV is rotated and a size of the FOV is adjusted based on signal region information, the FOV may be changed to a logical FOV (gFOV). As the size of the FOV is changed, the number of pixels included in the FOV, that is, a size of matrices of pixels, is also modified. In the exemplary embodiment of FIG. 15, a size of logical-k space is different from a size of k-space corresponding to the FOV. As digital data is obtained in logical k-space corresponding to the logical FOV (gFOV), an MR image may be generated. The MR image is substantially the same as an MR image generated based on digital data that is obtained in k-space, and the two MR images differ only in terms of coordinates. The MR image obtained from the logical k-space may be displayed on a screen of the output unit 64 (see FIG. 1) based on a logical FOV or may be displayed based on a FOV.

In regard to the first sampling pattern, an FOV does not need to be rotated, but a size of the FOV may be adjusted based on signal region information so that the FOV is changed to a logical FOV. Then, digital data of logical k-space corresponding to the logical FOV may be obtained.

As described above, the RF coil 26 of FIG. 1 may include RF coils of various channels such as a 16-channel, a 32-channel, a 72-channel, and a 144-channel. That is, according to some exemplary embodiments, RF coils of an MRI system may include multiple channel coils. Hereinafter, exemplary embodiments in which RF coils include multiple channel coils will be described in detail below with reference to FIG. 16.

Figure 16:
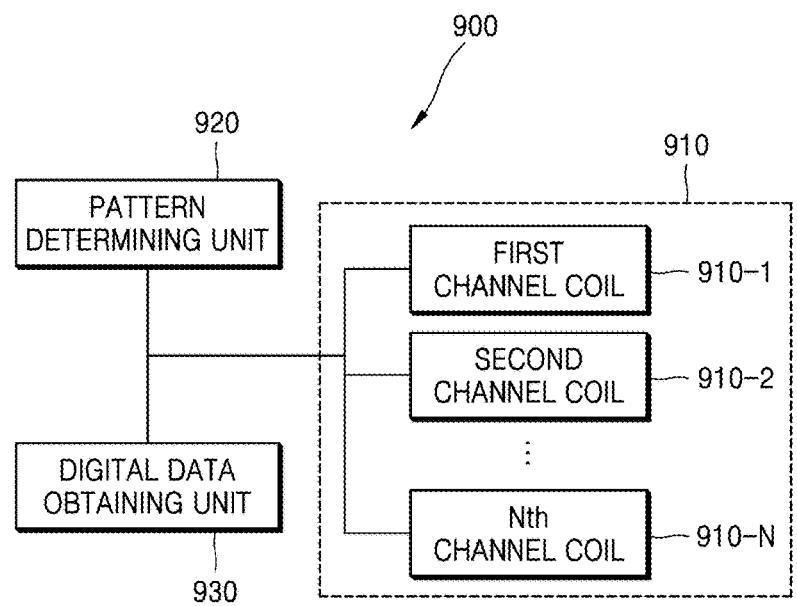
FIG. 16 illustrates an MRI apparatus according to an exemplary embodiment.

FIG. 16 illustrates an MRI apparatus 900 according to some exemplary embodiments.

Referring to FIG. 16, the MRI apparatus 900 includes an RF coil 910, a sampling pattern determining unit 920 (e.g., sampling pattern determiner), and a digital data obtaining unit 930 (e.g., digital data obtainer). The RF coil 910 includes multiple channel coils, that is, first through Nth channel coils 910-1, 910-2, . . . , 910-N (where N is a natural number). Each of the N channel coils 910-1, 910-2, . . . , 910-N receives an MR signal emitted from an object. The sampling pattern determining unit 920 may determine a sampling pattern of k-space based on sensitivity of the channel coils 910-1, 910-2, . . . , 910-N and signal region information which is information about a signal region where an MR signal is generated in an object.

The sampling pattern determining unit 120 of FIG. 6 described above determines one of a plurality of candidate sampling patterns, and may determine a sampling pattern such that a correlation between an interest sensitivity pattern, which is a sensitivity pattern in an image of interest, and an aliasing sensitivity pattern, which is a sensitivity pattern in an aliasing artifact, is the lowest.

The sampling pattern determining unit 920 of FIG. 9 may determine a sampling pattern that allows a correlation to be lowest overall, based on a correlation between an interest sensitivity pattern and an aliasing sensitivity pattern with respect to each of the channel coils 910-1, 910-2, . . . , 910-N.

For example, when the RF coil 910 includes 16 channel coils, and when the first sampling pattern is appropriate for eleven channel coils and the second sampling pattern is appropriate for five channel coils, the sampling pattern determining unit 920 may determine the first sampling pattern as a sampling pattern of k-space. However, this is merely an example for convenience of description. According to another exemplary embodiment, the sampling pattern determining unit 920 may obtain a correlation coefficient which is used to digitally represent a correlation between an interest sensitivity pattern and an aliasing sensitivity pattern with respect to each channel coil, and determine a sampling pattern that allows a lowest correlation coefficient with respect to all channel coils, as a sampling pattern.

As an MR signal is received from each of the channel coils 910-1, 910-2, . . . , 910-N, the digital data obtaining unit 930 samples the MR signal received with respect to each of the channel coils 910-1, 910-2, . . . , 910-N by using the determined sampling pattern to obtain digital data with respect to each k-space. Thus, the digital data obtaining unit 930 obtains digital data with respect to each of N k-spaces with respect to the channel coils 910-1, 910-2, . . . , 910-N.

The digital data obtaining unit 930 may obtain an MR image by image processing based on N pieces of k-space digital data. An image processing method may be a typical image reconstruction method. For example, an image reconstruction method may be parallel imaging or compressed sensing.

Figure 17:
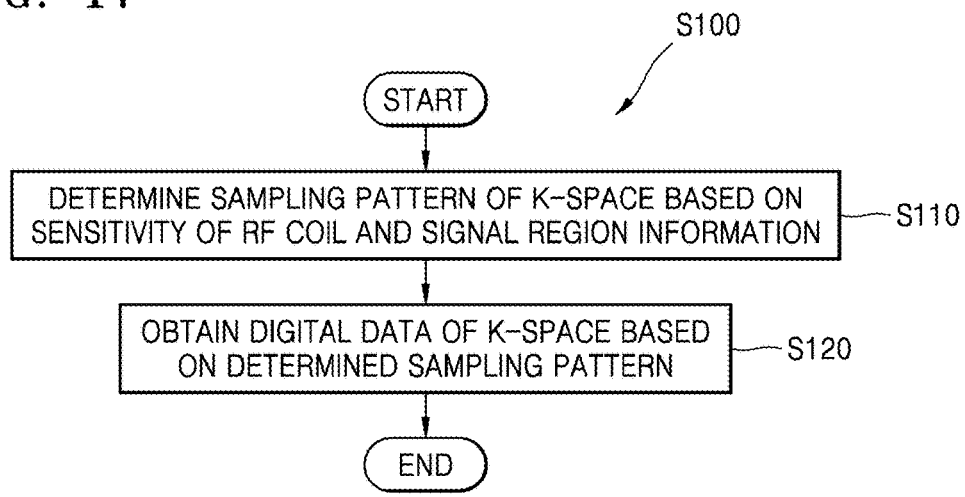
FIG. 17 is a flowchart of a method of generating an MRI image according to an exemplary embodiment.

FIG. 17 is a flowchart of a method (S100) of generating an MRI image according to an exemplary embodiment.

Referring to FIG. 17, a sampling pattern of k-space is determined based on sensitivity of RF coils and signal region information in operation S110. In operation S120, an MR signal is sampled based on the determined sampling pattern to obtain digital data of k-space.

Figure 18:
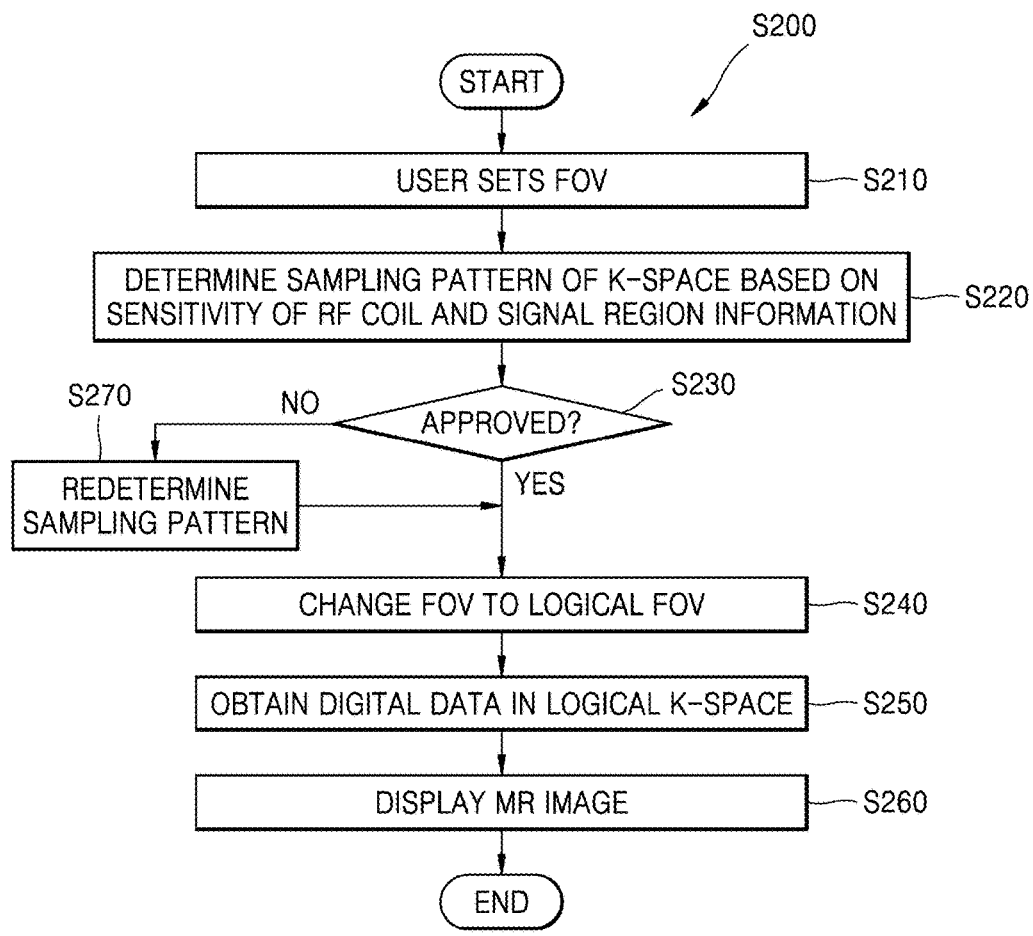
FIG. 18 is a flowchart of a method of generating an MRI image according to another exemplary embodiment.

FIG. 18 is a flowchart of a method (S200) of generating an MRI image according to another exemplary embodiment.

Referring to FIG. 18, an FOV is set by a user in operation S210. The user may input information about an FOV to be set, via the input unit 66. A sampling pattern of k-space is determined based on sensitivity of an RF coil and signal region information in operation S220. The user is requested to select whether the determined sampling pattern is approved or not in operation S230.

If the request for approval is declined or approval of the user is not input for a preset time period, a sampling pattern is redetermined in operation S270. A sampling pattern may be redetermined using various methods. For example, a sampling pattern may be redetermined based on image parameter information such as an FOV or resolution. The FOV is set by the user in operation S210, and the resolution may also be set by the user. Alternatively, a sampling pattern set as a default may be determined as a sampling pattern. Alternatively, the method may return to operation S220 to redetermine a sampling pattern. However, the number of times the method may return to operation S220 may be restricted so that the number of times does not exceed a predetermined number of times. If the predetermined number of times is exceeded, a sampling pattern may be redetermined based on image parameter information or the like, or a sampling pattern set as a default may be determined as a sampling pattern.

When a sampling pattern is approved or a sampling pattern is redetermined, an FOV may be changed to a logical FOV in operation S240. However, if the FOV does not need to be rotated or if a size of the FOV does not need to be changed, the FOV may not be changed to a logical FOV. In this case, the logical FOV and the FOV may be processed as being identical.

In operation S250, digital data is obtained in logical k-space corresponding to the logical FOV. In operation S260, an MR image generated based on digital data is displayed on the output unit 64 (see FIG. 1). Here, the MR image may be displayed based on an FOV before being changed or based on a logical FOV.

The methods S100 and S200 of generating an MRI image of FIGS. 17 and 18 may be performed by the MRI system illustrated in FIG. 1 or by the MRI apparatuses shown in FIG. 6 or 16, or another apparatus altogether. Each operation of the methods S100 and S200 of generating an MRI image may be performed using the above-described method.

The exemplary embodiments can be written as computer programs that can be implemented in general-use digital computers that execute the programs using a computer readable recording medium.

Examples of the computer readable recording medium include read-only memory (ROM), random-access memory (RAM), CD-ROMs, magnetic tapes, floppy disks, optical data storage devices, etc. (e.g., transmission through the Internet).

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A magnetic resonance imaging (MRI) apparatus, comprising:
    a radio frequency (RF) coil configured to receive a magnetic resonance (MR) signal emitted from an object; and
    an image processor configured to:
        determine a sampling pattern of k-space based on a sensitivity of the RF coil and signal region information which is information about a signal region where the MR signal is generated, and
        obtain digital data of the k-space by sampling the MR signal based on the determined sampling pattern.

2. The MRI apparatus of claim 1, wherein:
    the image processor is further configured to:
        obtain an aliasing image based on the digital data, the aliasing image comprising an image of interest which is an image of the signal region and an aliasing artifact, and
        determine the sampling pattern from among a plurality of candidate sampling patterns such that a correlation between an interest sensitivity pattern which is a pattern of the sensitivity of the RF coil in the image of interest and an aliasing sensitivity pattern which is a pattern of the sensitivity of the RF coil in the aliasing artifact is a minimum correlation among a plurality of correlations.

3. The MRI apparatus of claim 2, wherein the plurality of candidate sampling patterns comprise a first sampling pattern in which the digital data is obtained from a sampling line in an axis direction in the k-space and a second sampling pattern in which the digital data is obtained in a zigzag shape in the k-space.

4. The MRI apparatus of claim 3, wherein the image processor is further configured to change a field of view (FOV) to a logical FOV, and obtain the digital data in logical k-space corresponding to the logical FOV.

5. The MRI apparatus of claim 4, wherein the image processor is further configured to obtain the logical FOV by rotating the FOV, and to obtain the digital data from a sampling line in an axis direction of the logical k-space.

6. The MRI apparatus of claim 5, wherein the image processor is further configured to obtain the logical FOV by changing a size of the FOV based on the signal region.

7. The MRI apparatus of claim 4, wherein:
    the image processor is further configured to obtain an MR image by removing the aliasing artifact from the aliasing image, and
    the MRI apparatus further comprises an outputter configured to display the MR image based on the logical FOV or based on the FOV.

8. The MRI apparatus of claim 1, further comprising an input device configured to receive commands from a user.

9. The MRI apparatus of claim 1, further comprising an input device configured to receive input indicating approval of the determined sampling pattern.

10. The MRI apparatus of claim 1, wherein the RF coil comprises a plurality of channel coils, and the sensitivity of the RF coil is based on a sensitivity of each of the plurality of channel coils.

11. The MRI apparatus of claim 10, wherein the image processor is further configured to obtain digital data of each of a plurality of k-spaces by sampling an MR signal received with respect to each of the plurality of channel coils, according to the determined sampling pattern.

12. A method of generating a magnetic resonance imaging (MRI) image, the method comprising:
    transmitting a radiofrequency (RF) signal towards an object;
    receiving a magnetic resonance (MR) signal emitted from the object via an RF coil;
    determining a sampling pattern of k-space based on a sensitivity of the RF coil and signal region information which is information about a signal region where the MR signal is generated; and
    obtaining digital data of the k-space by sampling the MR signal based on the determined sampling pattern.

13. The method of claim 12, further comprising:
    obtaining an aliasing image by performing Fourier transformation (FT) on the digital data of the k-space, the aliasing image comprising an image of interest which is an image of the signal region and an aliasing artifact,
    wherein the determining of the sampling pattern comprises determining the sampling pattern from among a plurality of candidate sampling patterns such that a correlation between an interest sensitivity pattern which is a pattern of the sensitivity of the RF coil in the image of interest and an aliasing sensitivity pattern which is a pattern of the sensitivity of the RF coil in the aliasing artifact is a minimum correlation among a plurality of correlations.

14. The method of claim 13, wherein the plurality of candidate sampling patterns comprises a first sampling pattern in which the digital data is obtained from a sampling line in an axis direction in the k-space and a second sampling pattern in which the digital data is obtained in a zigzag shape in the k-space.

15. The method of claim 14, further comprising:
    adjusting a field of view (FOV) to change the FOV to a logical FOV; and
    obtaining the digital data in logical k-space corresponding to the logical FOV.

16. The method of claim 15, wherein:
    the adjusting of the FOV comprises rotating the FOV, and
    the obtaining of the digital data comprises obtaining the digital data from a sampling line in an axis direction of the logical k-space.

17. The method of claim 15, further comprising:
    receiving information for setting the FOV; and
    receiving approval of the determined sampling pattern from a user.

18. The method of claim 12, wherein the RF coil comprises a plurality of channel coils, and sensitivity of the RF coil is based on a sensitivity of each of the plurality of channel coils.

19. The method of claim 18, wherein the obtaining of the digital data comprises obtaining the digital data with respect to each of a plurality of k-spaces by sampling an MR signal received with respect to each of the plurality of channel coils, by using the determined sampling pattern.

20. A non-transitory computer readable recording medium having embodied thereon a program for executing the method of generating an MRI image of claim 12.

21. An imaging apparatus, comprising:
 a radio frequency (RF) coil configured to receive a magnetic resonance (MR) signal emitted from an object, the RF coil being positioned at a coil geometry indicating a position of the RF coil relative to a field of view (FOV) of the object; and
 an image processor configured to determine a sampling pattern to be used to sample digital data obtained from the MR signal based on the coil geometry.

22. The imaging apparatus of claim 21, wherein:
 the FOV is located within a two-dimensional plane defined by a first axis and a second axis perpendicular to the first axis, and
 the coil geometry comprises one of a first coil geometry in which the RF coil is parallel to the first axis, and a second coil geometry in which the RF coil is inclined related to the first axis.

* * * * *